United States Patent [19]
Kawaguchi et al.

[11] Patent Number: 5,253,212
[45] Date of Patent: Oct. 12, 1993

[54] SEMICONDUCTOR MEMORY IC AND SEMICONDUCTOR MEMORY DEVICE

[75] Inventors: Atsuo Kawaguchi; Hiroshi Motoda, both of Saitama, Japan

[73] Assignee: Hitachi, Ltd., Tokyo, Japan

[21] Appl. No.: 801,351

[22] Filed: Dec. 2, 1991

[30] Foreign Application Priority Data

Dec. 1, 1990 [JP] Japan .................................. 2-400077

[51] Int. Cl.[5] .............................................. G11C 8/00
[52] U.S. Cl. ................................ 365/230.01; 365/233
[58] Field of Search .............. 365/230.01, 233, 189.12, 365/236, 230.08, 189.08

[56] References Cited

U.S. PATENT DOCUMENTS

| | | | |
|---|---|---|---|
| 3,351,913 | 11/1967 | Pine ................................. | 365/230.01 |
| 4,491,910 | 1/1985 | Caudel ............................ | 365/230.03 |
| 4,549,283 | 10/1985 | McDermott ...................... | 365/236 |
| 4,819,211 | 4/1989 | Takagi ............................. | 365/230.01 |
| 5,058,076 | 10/1991 | Kiuchi ............................. | 365/230.01 |

Primary Examiner—Eugene R. LaRoche
Assistant Examiner—A. Zorabian
Attorney, Agent, or Firm—Antonelli, Terry, Stout & Kraus

[57] ABSTRACT

A semiconductor memory IC including an address value register, an adder and an address difference signal line, wherein an address for operation of the semiconductor memory IC is specified by an address difference signal representing an increment/decrement of the address value register An optional address can be specified by an increment/decrement signal, and all memory cells can be addressed even though the number of terminals is smaller than that required for specifying an absolute value of an address, so that the semiconductor memory IC can be reduced in size. To form a semiconductor memory device by using this semiconductor memory IC, an address memory unit, an address value difference computing unit and an addressing unit are provided. When operating the memory device, a target address in the memory unit can be reached by specifying a difference between the target address and the address held in the address memory unit.

16 Claims, 10 Drawing Sheets

SEMICONDUCTOR MEMORY IC AND SEMICONDUCTOR MEMORY DEVICE

BACKGROUND OF THE INVENTION

This invention relates to a semiconductor memory IC, and more particularly to a semiconductor memory IC with a reduced number of signal lines and a semiconductor memory device for a computer, for example, which memory device uses this semiconductor memory IC.

With the ever increasing degree of integration of semiconductor memory ICs such as experienced in recent years, a current important theme is to reduce the number of pins (address signals) to the extent feasible. Examples of schemes at reducing the number of prior include supplying address signals by time sharing. This has not been found to be sufficient, however.

SUMMARY OF THE INVENTION

With respect to conventional semiconductor memory ICs, as the degree of integration rises, the number of address pins increases which results in IC packaging cost increases which leads to increased production cost; furthermore, the IC increases in size. This contributes to an increased size of memory devices using semiconductor memory ICs, and is one of the reasons for the cost rise of memory devices.

In accordance with the present invention a semiconductor memory IC can be made to supply an address value difference when specifying an address without increasing the number of address pins even if the degree of integration increases. This new technique provides benefits including cost reduction of IC packaging, and therefore, a reduction in IC production cost, and a reduced IC size.

Needless to say, for memory devices which require random access at extremely high speed, for example, it is essential to provide lines for all address signals. However, memory devices, such as semiconductor disk devices, which are used as auxiliary memory devices of computers and video memories need not have such a high access speed. Nevertheless they are expected to have much higher access speed than memory devices which have a mechanical structure, such as magnetic disks.

In view of the above problem, this invention has as an object to make it possible to address all memory cells in a semiconductor memory IC by a reduced number of address signal lines, to enable the semiconductor memory IC to operate at an expected degree of high speed and reduce its size, and to provide a memory device in reduced size by adopting this small-sized semiconductor memory IC.

The semiconductor memory IC according to the present invention is provided with a register capable of storing an address value large enough to address all memory cells in the semiconductor memory cell array and all the memory cells can be addressed through external address lines by using only an increment or decrement of address values stored in the memory.

Therefore, in the semiconductor memory IC according to the present invention, since address information is specified by an increment or decrement of the address values stored in the memory, all address information need not be addressed from the outside of the memory, so that the number of address signal lines can be reduced and the memory can be decreased in size or increased in the degree of integration.

By using semiconductor memory ICs arranged as described, a semiconductor memory device can be so constructed that all memory cells in the memory can be addressed by a small number of address lines, so that the semiconductor memory can be reduced in size.

DESCRIPTION OF THE PREFERRED EMBODIMENTS

A conventional memory IC will first be described briefly before proceeding to description of the semiconductor memory IC according to the present invention.

Figure 1:
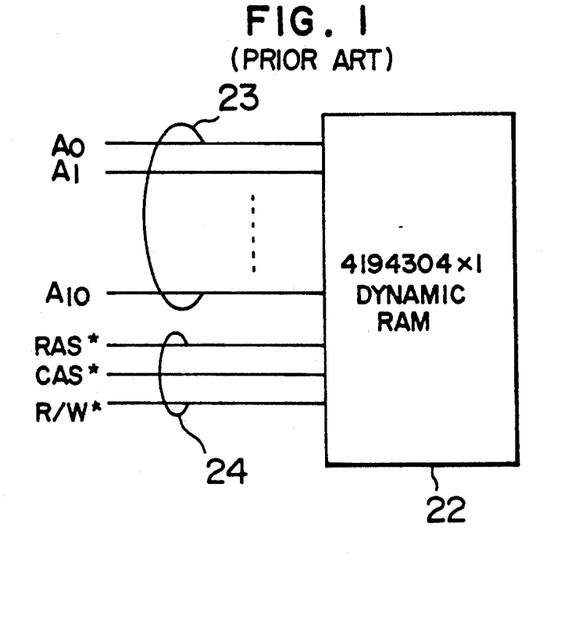
FIG. 1 shows an example of a conventional semiconductor memory IC.
Figure 2:
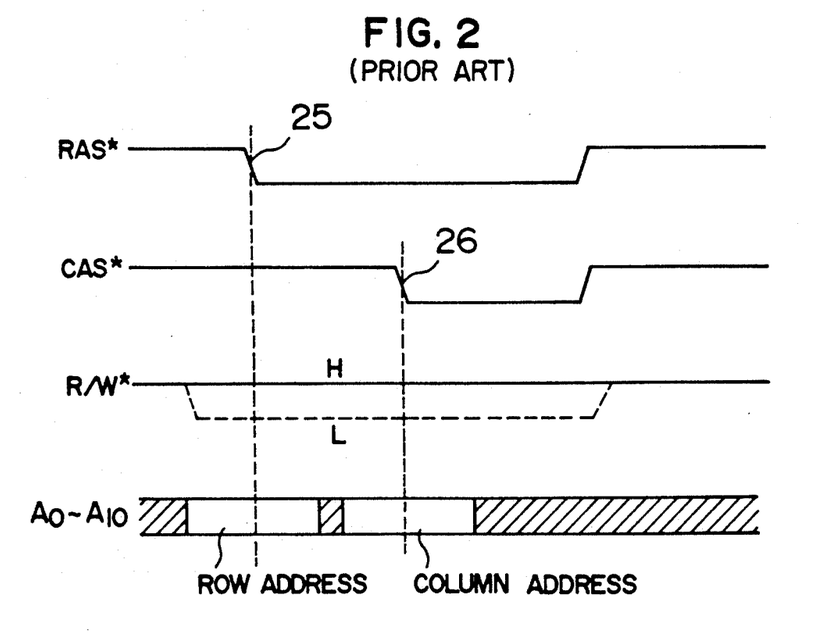
FIG. 2 is an operation timing chart in an example of a conventional semiconductor memory IC.

FIG. 1 shows 4M-bit dynamic RAM as a conventional semiconductor memory IC. In FIG. 1, reference numeral 22 denotes a semiconductor memory IC proper and 23 denotes address signal lines connected to the semiconductor memory IC, comprising eleven lines $A_0$, $A_1$ to $A_{10}$. Reference numeral 24 denotes clock signal lines connected to the semiconductor memory IC, comprising three lines RAS*, CAS* and R/W*. The semiconductor memory IC, e.g., 4M-bit dynamic RAM includes $2^{22}$ memory cells, and permits information in an arbitrary memory cell to be read and rewritten. FIG. 2 shows the operation timing of this memory. At a falling edge 25 of signal RAS*, a row address is read into the memory IC, while at a falling edge 26 of signal CAS*, a column address is read into the memory IC. Altogether, 22-bit address information is used to specify a memory cell in the memory IC. The operation mode of the memory is decided by the level of signal R/W* occurring when the signal CAS* falls. When the signal R/W* is at H level, data can be read, and when this signal is at L level, data can be written.

The semiconductor memory IC according to the present invention is the same as the conventional semiconductor memory IC in terms of the basic operation, but differs from the conventional one in that a new technique has been schemed for specifying an address.

An embodiment of this invention will be described with reference to the drawings.

Figure 3:
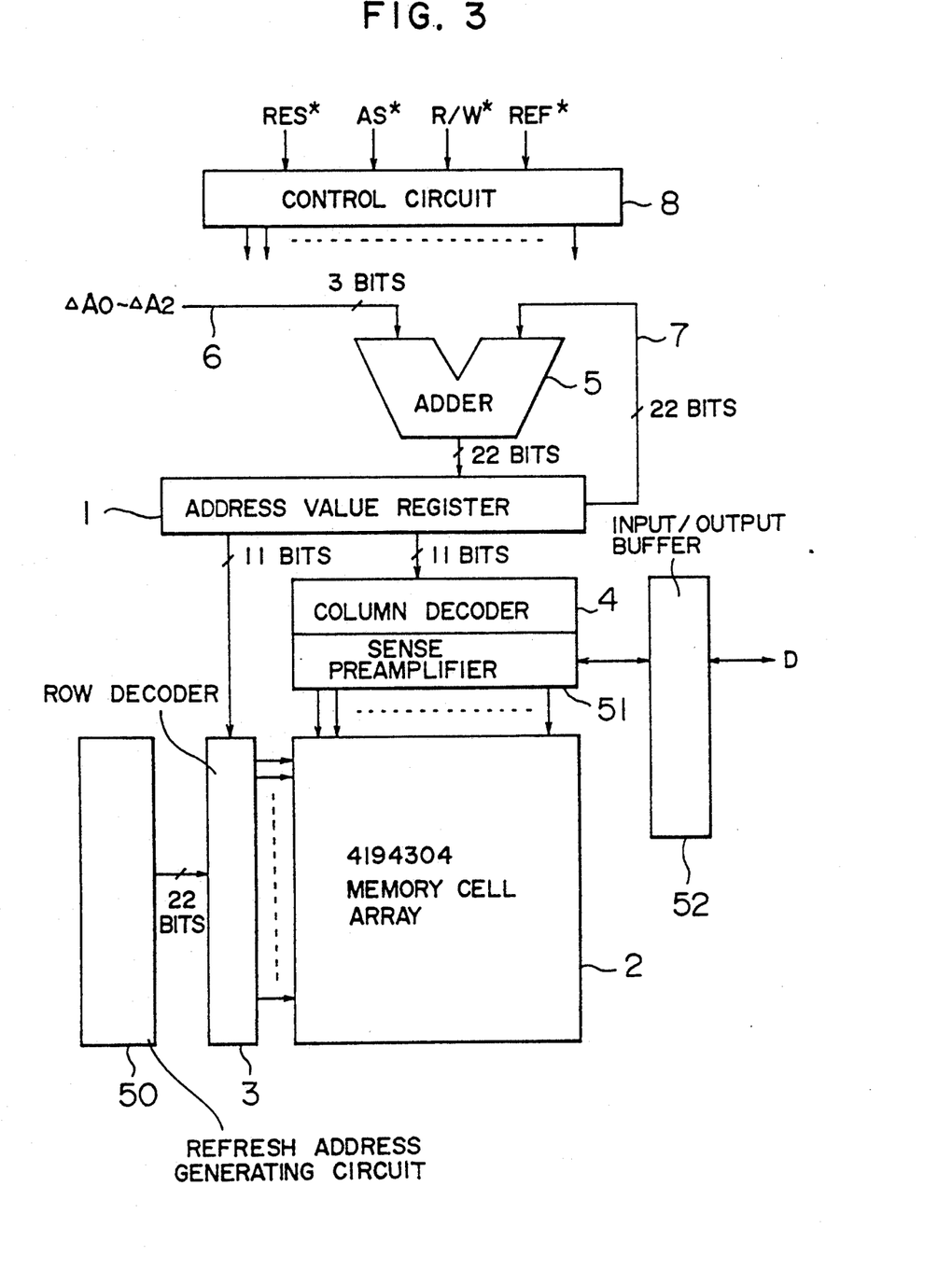
FIG. 3 is a block diagram showing an embodiment of the semiconductor memory IC according to the present invention.
Figure 4:
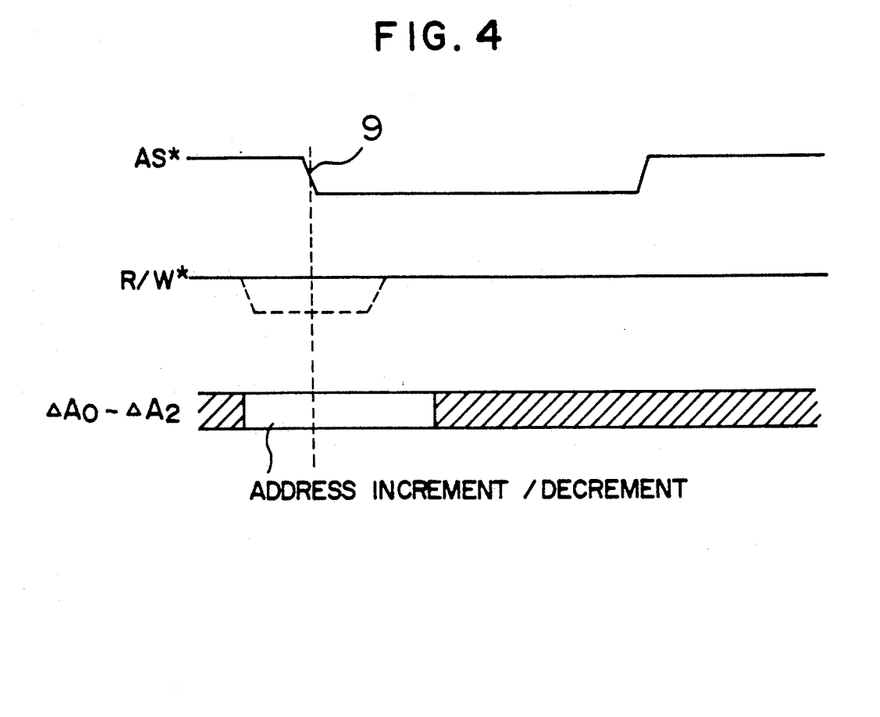
FIG. 4 is an operation timing chart of the semiconductor memory IC according to the present invention.

FIG. 3 is a block diagram showing an embodiment of the semiconductor memory IC according to the present invention. FIG. 4 shows the operation timing of the semiconductor memory IC.

In FIG. 3, a current address value is held in the address value register 1, and one of the memory cells ($2^{22}$ memory cells in a 4M-bit dynamic RAM) in a memory cell array 2 is specified through a row decoder 3 and a column decoder 4. Reference numeral 5 denotes an adder (e.g. adder-subtracter) which adds an address increment/decrement signal $\Delta A0$, $\Delta A1$, and $\Delta A2$, supplied in 2s complement form through address increment/decrement signal lines 6, to the current address value 7, and an addition result is stored as a new address in the address register 1. A control circuit 8 generates control signals necessary for changing a value held in the address value register 1, controlling read/write cycles, refreshing memory cell array and so forth. Refreshing the memory cell array is necessary only when dynamic RAMs are used, and if this is the case, the dynamic RAMs are refreshed at the addresses specified by a refresh address generating circuit. Data written in or read from the memory cell array 2 is input or output through a sense preamplifier 51 and an input/output buffer 52.

As shown in FIG. 4, at a falling edge 9 of the address strobe signal AS*, the address increment/decrement signal by bits $\Delta A0$ to $\Delta A2$ is read into the memory IC, so that the memory shifts from the standby state to the operating state. At this time, by the adder shown in FIG. 3, the read increment or decrement expressed by bits $\Delta A0$ to $\Delta A2$ and the value 7 from the address value register 1 are added, and a memory cell selecting operation in the memory cell array 2 is started. After a memory cell is selected, data is read or written according to an operation mode selected by the read/write specification signal R/W*.

The address value register 1 is initialized and set to an initial value specified at the time of device manufacture when a power supply for a memory device incorporating this semiconductor memory IC is turned on or when the address initialization signal RES* is made effective at an optional moment. By this scheme, at the start of use or at an optional moment, the address value of the address register 1 held in the semiconductor memory IC is made coincident with the address value held in a control unit (not shown) of the memory device incorporating the semiconductor memory IC. As candidates for the initial value, there are a value which is intermediate between the maximum and minimum values, the minimum value and the maximum value of the address value that the semiconductor memory IC can take on. However, this initial value available cannot be changed after the memory IC has been manufactured. In this embodiment, a value which is intermediate between the maximum and minimum values is used so that the greatest number of device operations (number of additions of a difference) necessary for specifying the maximum address value is equal to the greatest number of device operations (number of subtractions of a difference) necessary for specifying the minimum address value.

Figure 5:
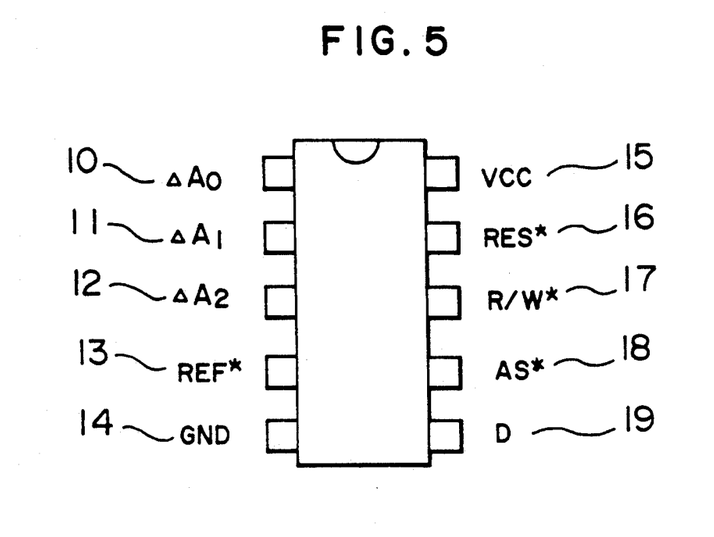
FIG. 5 is an external view of an embodiment of the semiconductor memory IC according to the present invention.

FIG. 5 shows an external appearance of the semiconductor memory IC according to this embodiment. In this embodiment, an IC package with ten signal pins is used. The signal pins are two included pins for the power supply (VCC 15 and GND 14), three pins for address increment/decrement (pin 10 for $\Delta A0$, pin 11 for $\Delta A1$, and pin 12 for $\Delta A2$), pin 18 for address strobe signal AS*, pin 17 for read/write specification signal R/W, pin 16 for address initialization signal RES* for the address value register 1, pin 19 for data input/output signal D, and pin 13 for refresh start signal REF*.

Figure 6:
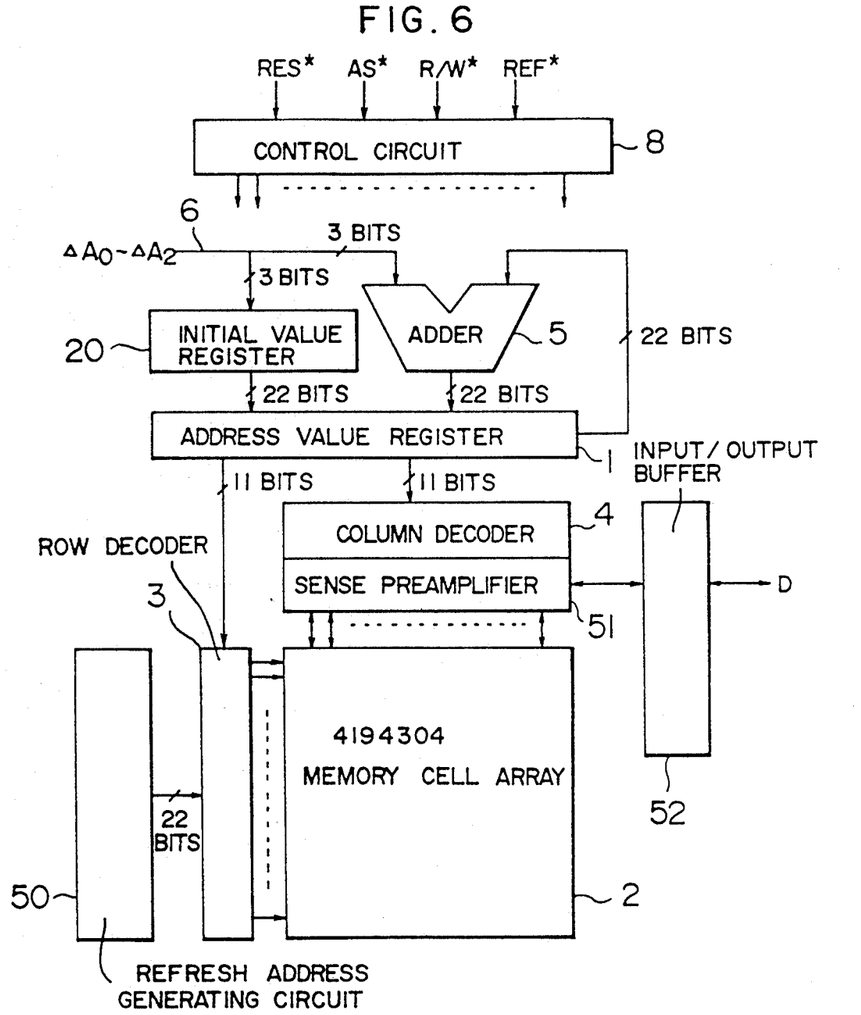
FIG. 6 is a block diagram of another embodiment of the semiconductor memory IC according to the present invention.

In the above embodiment, the initial value of the address value register 1 has been set fixedly in the circuit at the time of manufacture. Another embodiment of the present invention in which the initial value can be set arbitrarily in a fixed range is shown in FIG. 6. In this other embodiment, an initial value register 20 is provided for storing an initial value of the address register 1.

In this embodiment, the signal lines 6 for supplying the address increment/decrement signal are also used for supplying an initial value to the initial value register 20, so that it is not necessary to provide an additional pin for setting an initial value. At a falling edge 21 of the address strobe signal AS* when the address initialization signal RES* is effective, the initial value register 20 stores as the initial value a value having A0, A1 and A2 at the three high-order bits supplied through the address increment/decrement signal lines 6 and zeros at the 19 low-order bits. Subsequently, this value in the initial value register 20 is loaded to the address value register 1. This makes it possible to set an initial address value in such a range as to accommodate changes in the three high-order bits. Also in this embodiment, the address value register 1 is initialized and set to the value in the initial value register 20 when the power supply to the memory device which uses this semiconductor memory IC is turned on or the address initialization signal RES* is made effective at an optional moment.

Figure 8:
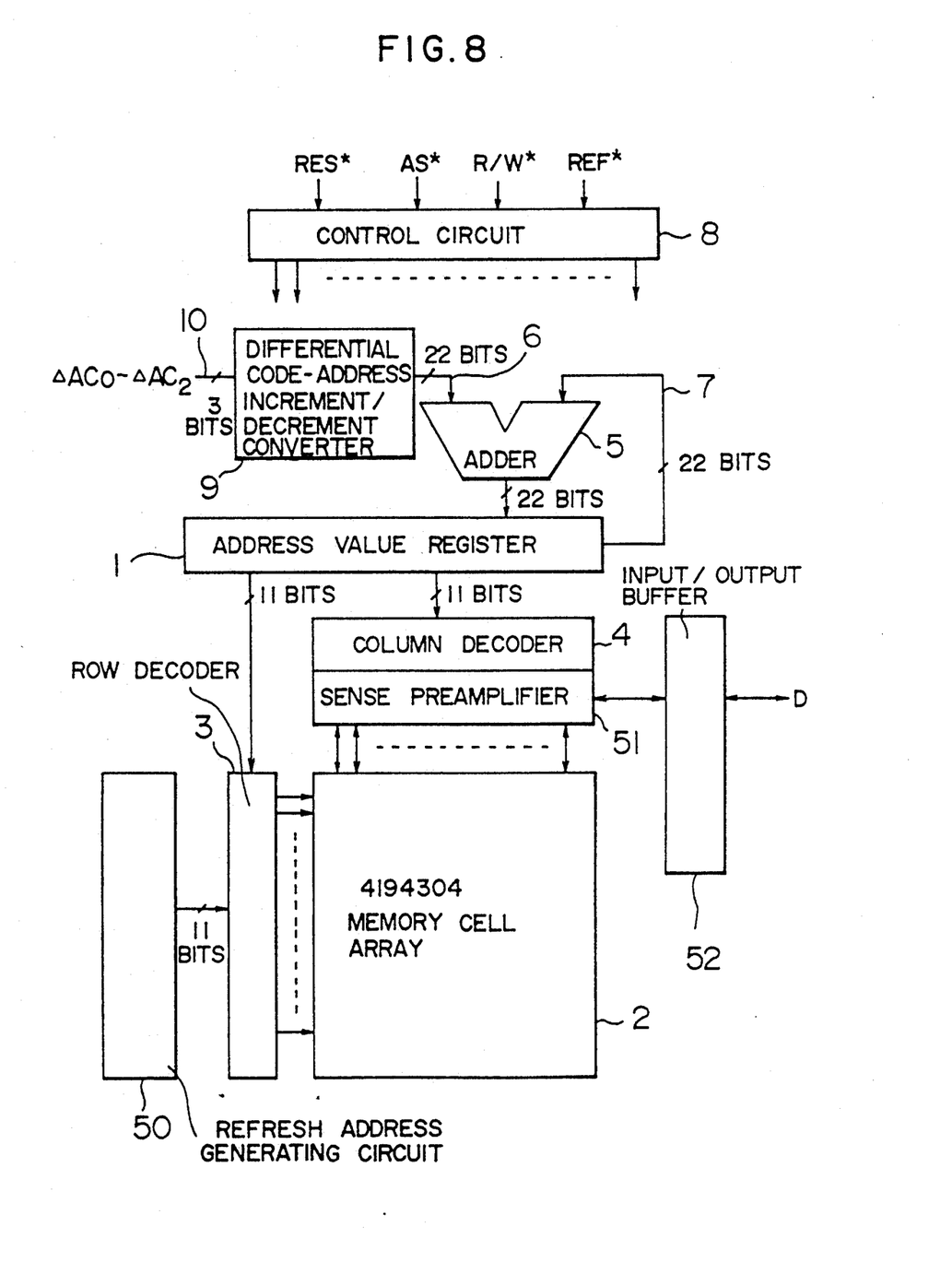
FIG. 8 is a block diagram showing an embodiment including a modification of the semiconductor memory IC according to the present invention shown in FIG. 3.

Referring to FIG. 8, description will now be made of an embodiment which can supply a greater difference than in the embodiment in FIG. 3 by decreasing the number of address signal lines based on the same idea as in the embodiment in FIG. 3.

In FIG. 8, an address is held in the address value register 1, and a memory cell in the memory cell array 2 is specified through the row decoder 3 and the column decoder 4. Reference numeral 5 denotes an adder which is the same as the adder (e.g. adder-subtracter) described in FIG. 3 in that the increment/decrement signal on the address increment/decrement signal lines 6, supplied in 2's complement form, is added to the current address 7 under control by the control circuit 8, and that a value resulting from the addition is stored in the address value register 1 as a new address. Reference numeral 9 denotes an address value difference code—address increment/decrement signal converter, and converts an address value difference code 10 into an address increment/decrement signal. More specifically, in this embodiment, an address value difference supplied to the semiconductor memory IC is in the form of a code, this code is converted into an address increment/decrement signal, which is further added to a value stored in the address value register 1. The operation of the embodiment shown in FIG. 8 is as shown in the waveform diagram in FIG. 4 (needless to say, the address increment/decrement signal is replaced by the address value difference code), and the external appearance of the semiconductor memory IC is the same as in FIG. 5.

There are various kinds of difference codes which represent address increment/decrement values in this embodiment. In this embodiment, possible numbers are obtained which can be assigned to difference codes 0 to 7 expressed in three bits as follows:

| Difference code | 0 | 1 | 2 | 3 | 4 | 5 | 6 | 7 |
|---|---|---|---|---|---|---|---|---|
| (1) a series of ±2 to the n-th power | −8, | −4, | −2, | −1, | 1, | 2, | 4, | 8 |
| (2) a series of ±2 to the 2n-th power | −64, | −16, | −4, | −1, | 1, | 4, | 16, | 64 |
| (3) a series of ±2 to the 4n-th power | −4096, | −256, | −16, | −1, | 1, | 16, | 256, | 4096 |
| (4) a series of ±2 to the 4n-th power and 0 | −256, | −16, | −1, | 0, | 1, | 16, | 256, | 4096 |

Generally, it is possible to specify 2 to the i-th power pieces of different address increments or decrements by difference codes of i bits. On the other hand, when assuming that a difference code of i bits comprises a sign (±) bit and a number n expressed by (i−1) bits in binary, if an increment or decrement of 2 to the kn-th power (k is a natural number) is assigned to a number n, an arbitrary address increment or decrement can be expressed by specifying an address difference code a relatively small number of times. In this case, as the radix of the increment or decrement, 2 has been used, but it goes without saying that any integer other than 0 and 1 can be used.

Description will then be made of an embodiment which uses a reduced number of address signal lines based on the same idea as in the embodiment in FIG. 8 mentioned above, and which permits an initial value in a code unlike with the embodiment in FIG. 6.

Figure 9:
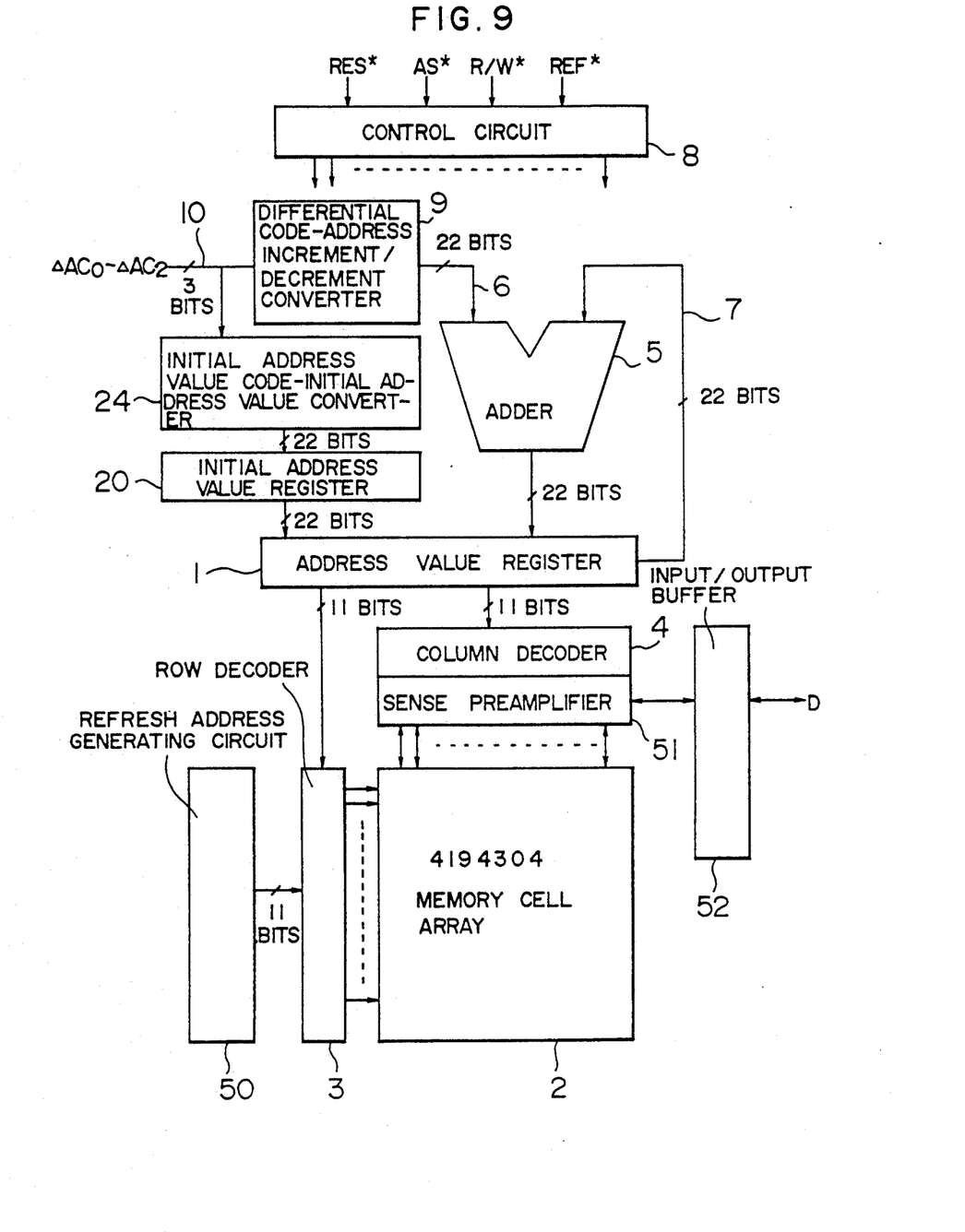
FIG. 9 is a block diagram showing an embodiment including a modification of the semiconductor memory IC according to the present invention shown in FIG. 6.

In FIG. 9, an address is held in the address value register 1, and a memory cell in the memory cell array 2 is specified through the row decoder 3 and the column decoder 4. Reference numeral 5 denotes an adder which is the same as the adder (e.g. adder-subtracter) described referring to FIG. 6 in that the address increment/decrement signal 6, supplied in 2s complement form, is added to the current address 7 under control by the control circuit 8, and that the addition result is stored in the address value register 1 as a new address.

Also in this embodiment, the address increment/decrement signal is supplied in the form of a code signal 10, and the address difference code—address increment/decrement signal converter 9 converts the address difference code 10 into an address increment/decrement signal.

In this embodiment, an initial address value is supplied to the initial address value register 20 in the same form of code data by using also for this purpose the signal line 10 for supplying an address difference code. Therefore, it is not necessary to provide another pin for setting an initial value. An initial address value code is converted by the initial address value code—initial address value converter 24 into an initial address value, which is supplied to the initial address value register 20.

Figure 7:
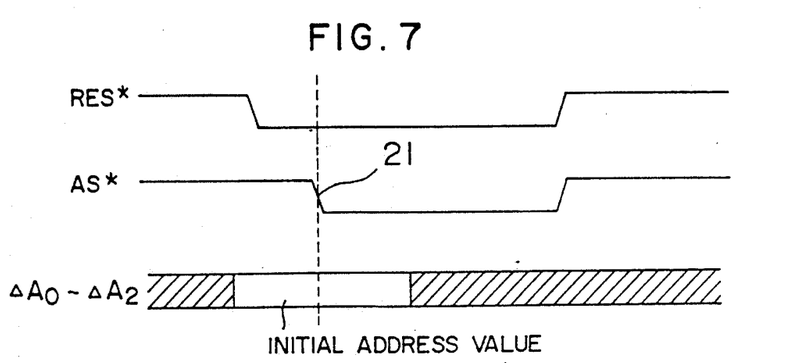
FIG. 7 is an initialization timing chart of the address value register in the embodiment of the semiconductor memory IC according to the present invention shown in FIG. 6.

Also in this embodiment, like the timing described referring to FIG. 7, the address value register 1 is initialized and set to the value in the initial value register 20 when the power supply to the memory device incorporating this semiconductor memory IC is turned on or when the address initialization signal RES* is made effective at any selected moment.

Description will next be made of a semiconductor memory device according to another embodiment of the present invention, formed by using the semiconductor memory IC in the above-mentioned embodiments.

First however, description will be given of a semiconductor memory device formed using a plurality of conventional semiconductor memory ICs and devoid of an address value register such as that with reference to FIG. 10.

Figure 10:
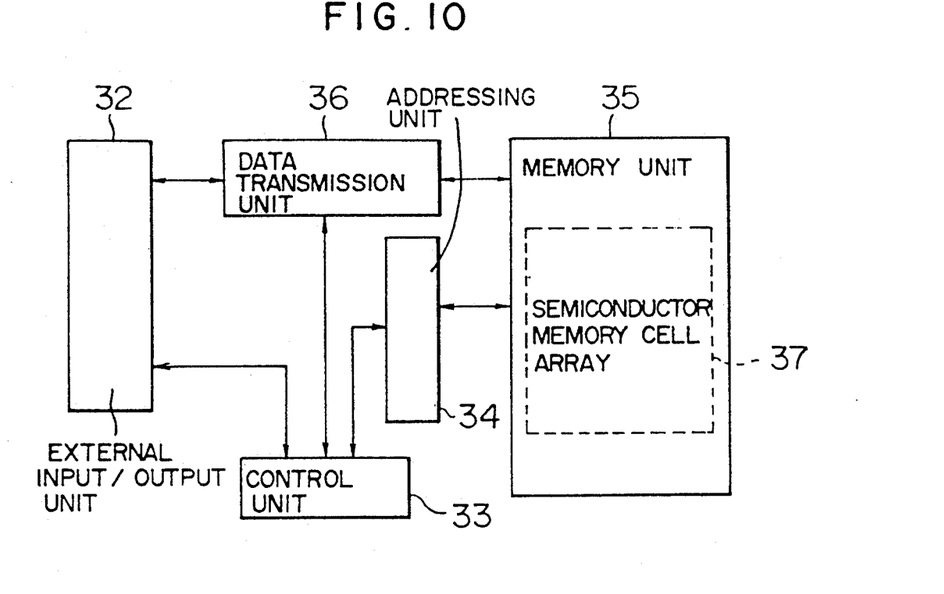
FIG. 10 shows an example of a conventional semiconductor memory device constructed by using a conventional semiconductor memory IC shown in FIG. 1.

In FIG. 10, reference numeral 35 denotes a memory unit for storing data, which unit includes a semiconductor memory IC array 37 comprising a plurality of semiconductor memory ICs such as described in reference to FIG. 1. Reference numeral 32 denotes an external input/output interface for data transmission between an external device, not shown, and the memory unit 35 and also for exchanging control information. Connected between the external input/output interface 32 and the memory unit 35 are an addressing unit 34/ a data transmission unit 36, and a control unit 33. An address specified through the external input/output interface 32 is calculated at the control unit 33, and supplied to the semiconductor memory IC of the semiconductor memory unit 35. Data at a specified address is read or written by data transmission through the data transmission unit 36. The operation of the entire memory device is controlled by the control unit 33. This semiconductor memory device has been put into practical use as a semiconductor disk, and its construction and operation have been well known, so that description of it is omitted.

Figure 11:
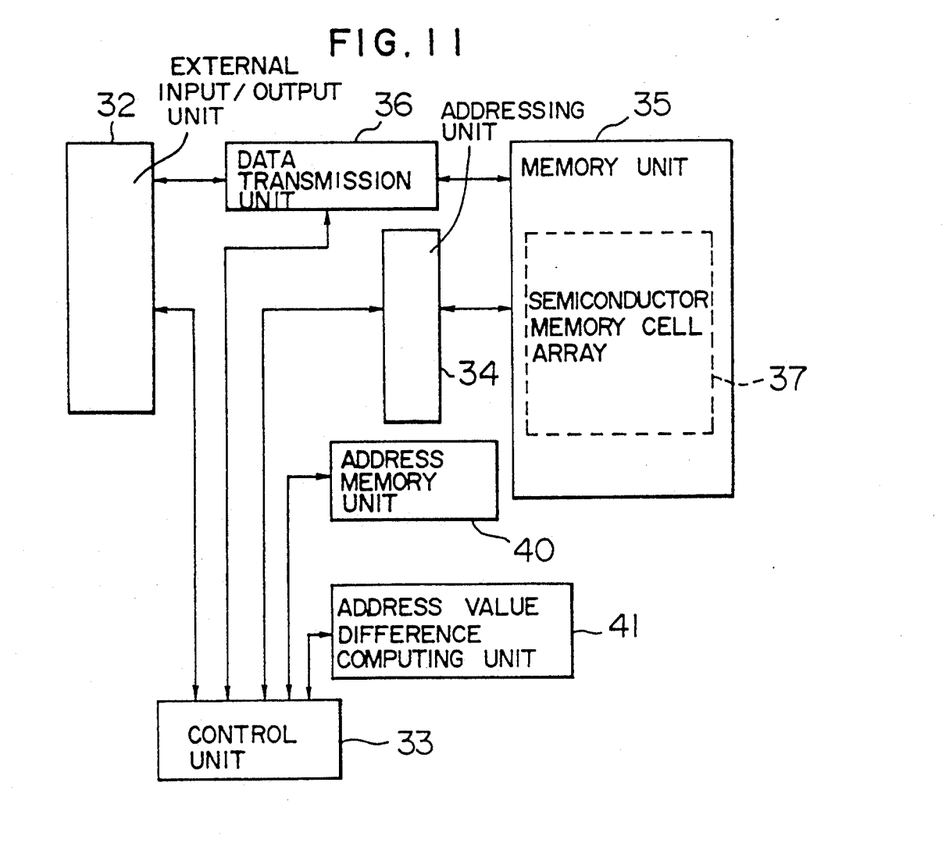
FIG. 11 shows an embodiment of the semiconductor memory device according to the present invention, constructed by using a semiconductor memory IC including an initial value register shown in FIG. 6.

With reference to FIG. 11, description will be made of the semiconductor memory device according to another embodiment of the present invention formed by using many a semiconductor memory IC having an address value register according to the present invention.

In FIG. 11, the memory unit 35, the semiconductor memory IC array 37, the data transmission unit 36, the external input/output interface 32, and the control unit 33 are essentially identical with those described referring to FIG. 10 in terms of function. In this embodiment, however, the semiconductor memory ICs constituting the semiconductor memory IC array have an address value register 1, and an actual address is specified according to the address stored in the address value register 1, so that a contrivance for this purpose is required. Furthermore, a control function not required in the memory device in FIG. 10 is required. For this reason, an address memory unit 40 and an address value difference computing unit 41 are added.

Description will be made of control and operation executed to correctly specify an address. In this embodiment, the address read lastly from the semiconductor memory IC array 37, that is, the address stored in the address value register 1 is held in the address memory unit. That this operation can be done at every access will become apparent from the following description. The address value difference computing unit 41 computes an address value difference between the address specified from outside and the address held in the address memory unit 40. The addressing unit 34 supplies the memory unit 35 with a computed address value difference in a manner suitable for the semiconductor memory IC used in the memory unit.

Description will be made of the memory unit comprising a semiconductor memory IC shown in FIG. 3 as an embodiment of the simplest arrangement. The address stored in the address memory unit 40 and the contents of in the address value register 1 in FIG. 3 are controlled so that they coincide with each other at the start of use or at an optional moment as described earlier. Specifically, the address value register 1 is initialized and set to an initial value specified at manufacture of the memory device when the power supply to the memory device using this type of semiconductor memory IC is turned on or the address initialization signal RES* is made effective at an optional moment. At this time, the address stored in the address memory unit 40 is made to coincide with this initial address value. By this, the address value held in the semiconductor memory IC can be made to coincide with the address value held in the control unit (not shown) of the memory device using this semiconductor memory IC.

Figure 12:
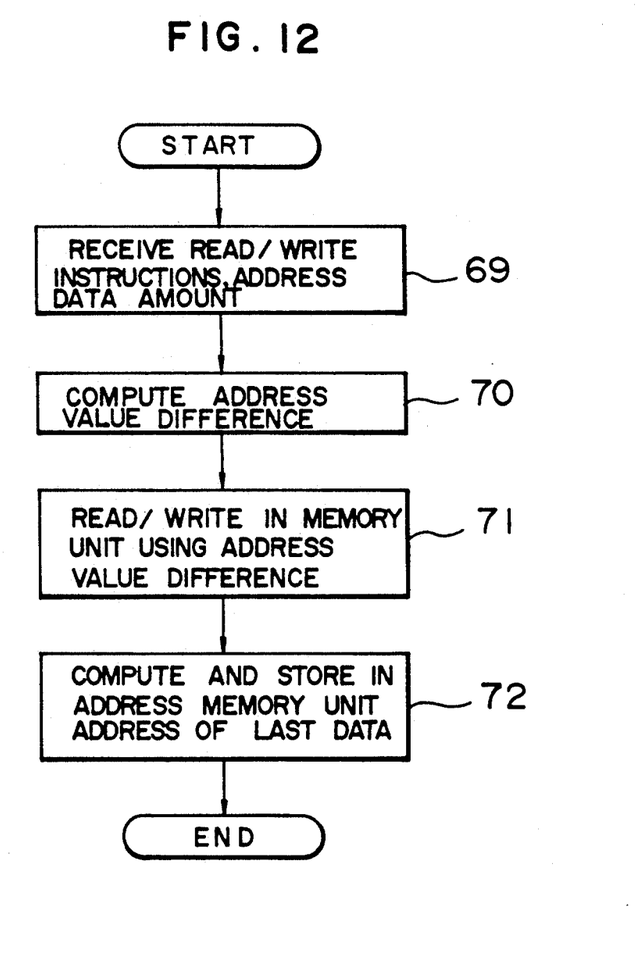
FIG. 12 is a flowchart showing an embodiment for specifying an address in the semiconductor memory IC of the semiconductor memory device shown in FIG. 11.

With reference to FIGS. 11, 12, and 3, the operation of this embodiment will be described. In FIG. 12, at step 69, an operation instruction, comprising a read/write instruction, an address to be accessed, and a data amount to be read or written, is received from an external device. Then, at step 70, an address value difference is computed between the address which is held in the address memory unit 40 and at which data has been read from or written into the memory unit and the address specified by the operation instruction. At step 71, the computed address value difference is supplied through the addressing unit 34 to the semiconductor memory IC array 37 in the memory unit 35. To be more specific, an address difference signal is given through the address difference signal lines 6, and this address value is added to the address value in the address value register 1, and using an address resulting from the addition, data at the target address is read or written. At step 72, the specified amount of data is read or written, and the address value at which data is read or written lastly is preserved in an address memory unit 40.

Figure 13:
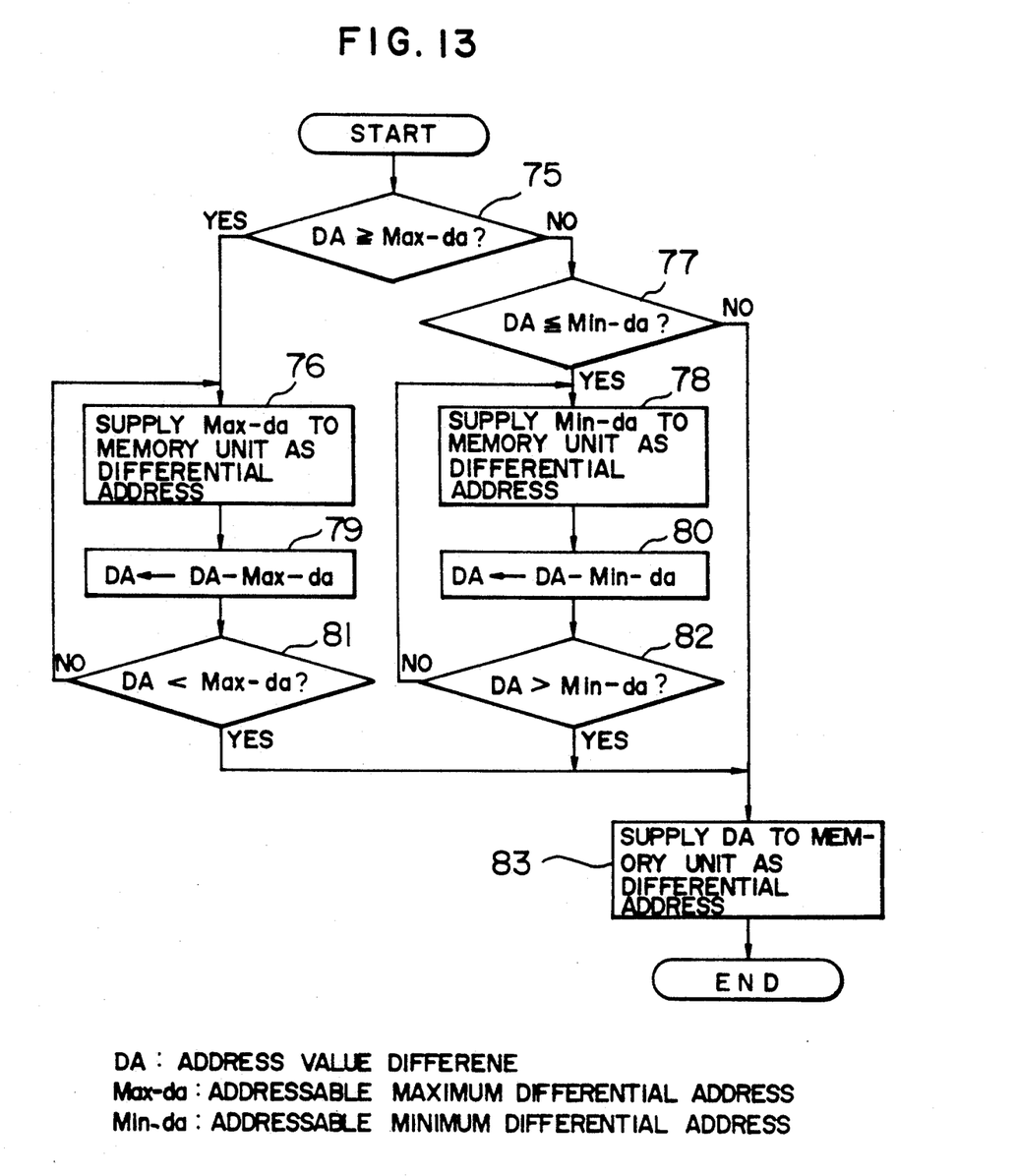
FIG. 13 is a flowchart showing in more detail an embodiment of process for computing a differential address in FIG. 2.

An example of the process of computing said address value difference will be described in more detail with reference to a flowchart in FIG. 13 and FIG. 3. An address value difference which will be given by this process is designated as DA, the maximum address difference that can be received by the semiconductor memory ICs constituting the semiconductor memory IC array 37 (the maximum difference signal that can be handled by a value expressed by bits $\Delta A0$ to $\Delta A2$, supplied on the address increment/decrement signal lines 6) is designated as Max-da, and the minimum address difference (the minimum difference signal that can be handled by a value expressed by bits $\Delta A0$ to $\Delta A2$, supplied on the address increment/decrement signal lines 6) is designated as Min-da. Those address differences are set in the control unit depending upon the semiconductor memory IC.

At step 75, a decision is made whether or not the address value difference DA is equal to or greater than the maximum address difference Max-da. If the decision is YES, at step 76, the maximum address difference Max-da is supplied as a differential address to the memory unit 35 (by the address increment/decrement address difference lines 6). If the decision is NO, a decision is made whether the address difference DA is equal to or greater than the minimum address difference Min-da. If the decision is YES, at step 78, the minimum address difference Min-da is supplied to the memory unit 35 (by the address increment/decrement signal lines 6). As a result, the address value in the address value register 1 in the semiconductor memory IC is decreased by that value difference. And at step 79 or 80, the value of the address difference DA is updated from the DA value to the DA value minus the differential address supplied at step 76 or 78. This process is repeated until YES is obtained at step 81 where a decision is made whether or not the updated differential address DA si smaller than the maximum address difference Max-data or until YES is obtained at step 82 where a decision is made whether or not the updated differential address DA is greater than the minimum address difference Min-da. Needless to say, at every repetition, the address value of the address value register 1 of the semiconductor memory IC is increased or decreased by that value difference. When the decision is NO at step 77, or YES at step 81 or 82, then at step 83 the last value difference DA is supplied as a differential address to the memory unit 35 (the address increment/decrement signal lines 6). As a result, the address value of the address value register 1 of the semiconductor memory IC is increased or decreased by that value difference and established as an actual address. For example, if the address value difference DA = +10, maximum address difference Max-da = +3, and minimum address difference Min-da = −3, procedure of address specification is +3→+3→+3→+1. Thus, four additions of address value differences are performed and an address is established.

At this time, in the address memory unit 40 in FIG. 11, naturally, the address value which is increased or decreased only by the initially given address difference DA is stored, and therefore, the address value of the address memory unit 40 coincides with the address value of the address value register 1 of the semiconductor memory IC.

Needless to say, the semiconductor memory device is so constructed as to read or write data after this actual address has been established.

In this embodiment, the arrangement is such that address information is controlled only by an address difference, and therefore, if the address difference is large and an absolute value of an address difference which is given at a time is small, the number of times of address specification is large, so that the operation speed of the semiconductor memory device has to be low.

One of the embodiments made to solve this problem supplies an address value difference signal in code to thereby obtain a large address difference with a smaller number of address difference signal lines, as in the embodiment in FIG. 8.

Figure 14:
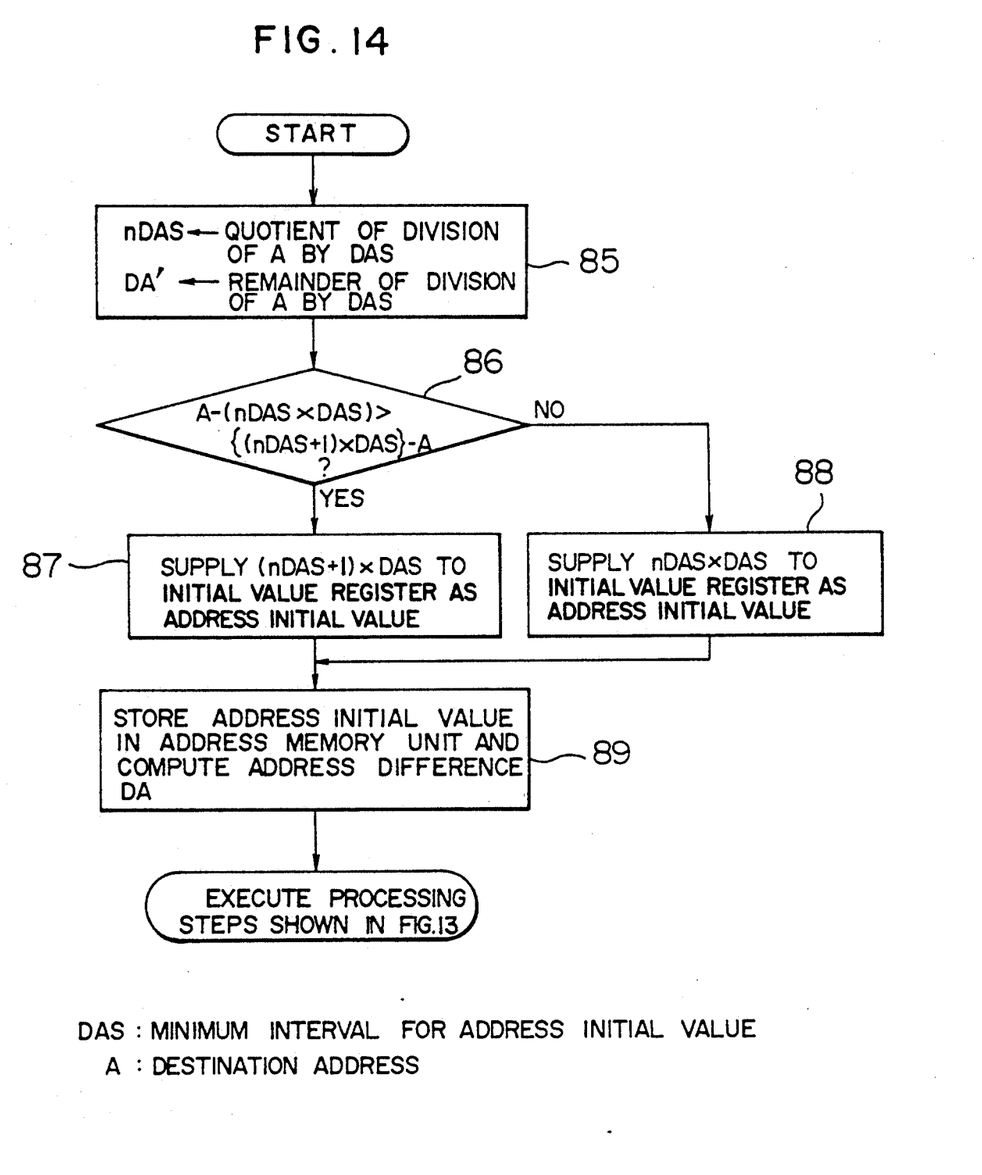
FIG. 14 is a flowchart showing another embodiment of computation of a differential address in the semiconductor memory IC of the semiconductor memory device shown in FIG. 12.

Another embodiment contrived to solve this problem will be described with reference to a flowchart in FIG. 14. This embodiment can be applied to a semiconductor memory device using semiconductor memory ICs having an initial value register as shown in FIG. 6.

More specifically, an address difference closest to the target address is computed, and after giving this address difference to the initial value register 20 of the semiconductor memory IC, the method shown in FIG. 12 is applied, thereby reducing the number of address specification. For example, when the target address A=107, supposing the current address is 0, if the current address value is varied from 0 to 107 by using the above-mentioned maximum address difference (the maximum address difference signal that can be handled by a value expressed by bits ΔA0 to ΔA2 supplied by the address increment/decrement signal lines 6), then the time required for this step is too long to be permissible in practical operation. However, if an adequate value can be set in the initial value register 20 shown in FIG. 6, it is possible from this value to vary the address value to the target address by addition or subtraction of address differences in a short time. This is what this embodiment intends to achieve.

To this end, computation is performed which will be described with reference to a flowchart in FIG. 14. Let DAS be the minimum interval for an initial address value that can be set in the initial value register 20. This minimum interval DAS is set in the control unit 8 depending upon the semiconductor memory IC used.

At step 85, the target address A is divided by the minimum interval DAS of an initial address value that can be set, and a quotient (integer) nDAS is obtained, and the target address A is divided by the minimum interval DAS of an initial address value that can be set, and a remainder DA' (integer) is obtained. At step 86, a comparison is made between A−(nDAS×DAS) and {(nDAS+1)×DAS}−A to see which is larger. When A−(nDAS×DAS) is larger and the decision is YES, at step 87, (nDAS+1)×DAS is supplied to the initial value register 20 as an initial address value. When {(nDAS+1)×DAS}−A is larger and the decision is NO, at step 88, nDAS×DAS is supplied to the initial value register 20 as an initial address value. At step 89, the value set at step 87 or 88 is supplied to the address memory unit 40 as an initial address value, and the remainder DA' (integer) of the above-mentioned division is used as an address difference in the flow of FIG. 13 mentioned above. Then, an address is set by an address difference according to the flow of FIG. 13.

Let us consider a case in which the target address A=107 mentioned above, if the minimum interval DAS of an initial address value that can be set is 16 and the minimum address difference Min-da=−3, the procedure of address specification at this time is an initial value 112 (=16×7)→−3→−2. More specifically, 107÷16=6, leaving a remainder of 11. Therefore, the initial value is set at 112, and by decreasing by −3 then −2 in this manner, a required address is reached.

In any of the embodiments of the present invention, the address increment/decrement or the initial address value are specified only by using the address increment/decrement signal lines ΔA0 to ΔA2. By using signal lines not directly related to address specification, an address increment or decrement or an initial address of many more bits can be specified. For example, when specifying an address increment or decrement, even if all signal lines other than the address strobe line are used, this does not affect the operation of the device at all.

In this embodiment, dynamic memory ICs are used which permit read/write operations but require to be refreshing. Obviously, this invention can be used with all semiconductor memory devices using address signals, including static memory ICs and read only devices.

We claim:

1. A semiconductor memory IC having timing signal pins and address signal pins, comprising:
    a memory cell array;
    an address value register for specifying an address to read/write data from/in said memory cell array, said address value register serving to hold a current address value; and
    an adder-substrater having inputs and an output, said output being coupled to said address value register, and said inputs being coupled to receive an increment/decrement signal supplied from said address signal pins and said current address value from said address value register,
    wherein said adder-subtracter in response to said increment/decrement signal and said current address value provides a new address value to be stored in said address value register, said new address value corresponds to an updated current address value in said address value register.

2. A semiconductor memory IC according to claim 1, wherein said address value register can be set at an initial value by a timing signal, said initial value is determined at the time of manufacture of said semiconductor memory IC.

3. A semiconductor memory IC according to claim 1, wherein said address value register can be set at an address value from outside said semiconductor memory IC by a combination of a timing signal and an address difference data signal.

4. A semiconductor memory IC according to claim 2, further comprising an initial address value register for setting an initial address value by a combination of a timing signal, an address signal and data signal, wherein said address value register can be controllably set tot eh initial address value of said initial address value register.

5. A semiconductor memory IC according to claim 3, further comprising a converter for converting an address difference code, supplied from outside of said semiconductor memory IC through said address signal pins, into said increment/decrement signal, said increment/decrement signal being in a form of an address increment or decrement of a specified value representative of the address difference code.

6. A semiconductor memory IC according to claim 4, further comprising a converter for converting an address code, supplied from outside of said semiconductor memory IC through said address signal pins, into an address value including said increment/decrement signal, wherein an initial address value can be set in said initial address value register or a new address value can be set in said address value register in accordance with said address code received.

7. A semiconductor memory device comprising:
at least one semiconductor memory IC having timing signal pins and address signal pins, each of which is comprised of:
a memory cell array,
an address value register for specifying an address to read/write data from/in said memory cell array, said address value register serving to hold a current address value, and
an adder-subtratcer having inputs and an output, said output being coupled to said address value register, and said inputs being coupled to receive an increment/decrement signal supplied from outside said semiconductor memory IC and said current address value from said address value register, wherein said adder-subtracter in response to said increment/decrement signal and said current address value provides a new address value to be stored in said address value register, said new address value corresponds to an updated current address value in said address value register;
an address memory unit for holding the same address value as said current address value held in said address value register of said semiconductor memory IC; and
means for supplying to said adder-subtracter said increment/decrement signal according to a difference between a target address supplied from outside said semiconductor memory device and an address held in said address memory unit.

8. A semiconductor memory device according to claim 7, wherein said semiconductor memory IC is arranged such that said address value register can be set to an initial value by a timing signal, said initial value is determined at time of manufacture of said semiconductor device.

9. A semiconductor memory device according to claim 7, wherein said semiconductor memory IC is arranged such that said address value register can be set at a specific address value, from outside said semiconductor memory IC, by a combination of a timing signal and an address difference data signal.

10. A semiconductor memory device according to claim 7, wherein said semiconductor memory IC further includes an initial address value register for setting an initial address value by a combination of a timing signal, an address signal and a data signal, and wherein said address value register can be set to the initial address value of said initial address value register.

11. A semiconductor memory device according to claim 7, wherein said semiconductor memory IC further including a converter for converting an address difference code into said increment/decrement signal, said increment/decrement signal is in a form of an address increment or decrement of a specified value representative of said address difference code supplied from outside said semiconductor memory IC, and said address difference code is representative of a difference between said target address and said address held in said address memory unit.

12. A semiconductor memory device according to claim 7, wherein said semiconductor memory IC further includes a converter for converting an address code, supplied from outside said semiconductor memory IC, into an address value and an initial address value register, and wherein an initial address value can be set in said initial address value register or a new address value can be set in said address value register in accordance with said address code received.

13. A semiconductor memory device according to claim 7, wherein said semiconductor memory IC further includes an initial address value register for holding an initial address value; and wherein the increment/decrement signal supplying means includes means for accessing said target address by setting said initial address value register to a specified initial address value and provides specified addresses as increment or decrement values to said address value register by:
calculating a quotient (Q), including an integer, and a remainder (R) through dividing said target address (A) by a minimum interval (DAS) of initial address values that said initial address value register can hold,
calculating a product (P0) of Q and DAS,
calculating a product (P1) of Q+1 and DAS,
setting the value of said initial address value and said address memory unit to P1 if A−P0 is greater than P1−A otherwise setting said initial address value to P0, and
providing the address value to said address value register as a difference of A and the value set to said initial address value register.

14. A semiconductor memory device according to claim 8, wherein said semiconductor memory IC includes an initial address value register for setting an initial address value by a combination of a timing signal, an address signal and a data signal, and wherein said address value register can be set to the initial address value of said initial address value register.

15. A semiconductor memory device according to claim 9, wherein said semiconductor memory IC further includes a converter for converting an address difference code into said increment/decrement signal, said increment/decrement signal is in a form of an address increment or decrement of a specified value representative of said address difference code, supplied from outside said semiconductor memory IC, and said address difference code is representative of the difference between said target address and said address held in said address memory unit.

16. A semiconductor memory device according to claim 10, wherein said semiconductor memory IC further includes a converter for converting an address code, supplied form outside through said semiconductor memory IC, into an address value including said increment/decrement signals, and wherein an initial address value can be set in said initial address value register or a new address value can be set in said address value register in accordance with said address code received.

* * * * *